United States Patent [19]

Scobey et al.

[11] Patent Number: 4,851,095

[45] Date of Patent: Jul. 25, 1989

[54] MAGNETRON SPUTTERING APPARATUS AND PROCESS

[75] Inventors: Michael A. Scobey; Richard I. Seddon; James W. Seeser; R. Russel Austin; Paul M. LeFebvre, all of Santa Rosa, Calif.; Barry W. Manley, Boulder, Colo.

[73] Assignee: Optical Coating Laboratory, Inc., Santa Rosa, Calif.

[21] Appl. No.: 154,177

[22] Filed: Feb. 8, 1988

[51] Int. Cl.[4] .............................................. C23C 14/34
[52] U.S. Cl. ......................... 204/192.12; 204/192.15; 204/192.26; 204/192.27; 204/298
[58] Field of Search ....................... 204/192.10, 192.12, 204/192.15, 192.26–192.29, 298, 298 PM, 298 MD, 298 MB, 298 MC, 298 SM; 118/719

[56] References Cited

U.S. PATENT DOCUMENTS

| | | | |
|---|---|---|---|
| 3,635,811 | 1/1972 | Lane | 204/192.15 |
| 3,829,373 | 8/1974 | Kuehnle | 204/298 |
| 4,142,958 | 3/1979 | Wei et al. | 204/192.11 |
| 4,361,472 | 11/1982 | Morrison | 204/192.12 |
| 4,420,385 | 12/1983 | Hartsough | 204/192.23 |
| 4,424,103 | 1/1984 | Cole | 204/192.11 |
| 4,637,869 | 1/1987 | Glocker et al. | 204/192.11 |
| 4,661,229 | 4/1987 | Hemming et al. | 204/192.13 |
| 4,674,621 | 6/1987 | Takahashi | 198/378 |
| 4,675,096 | 6/1987 | Tateishi et al. | 204/298 |
| 4,692,233 | 9/1987 | Casey | 204/298 |

FOREIGN PATENT DOCUMENTS

| | | | |
|---|---|---|---|
| 62-287073 | 12/1987 | Japan | 204/298 |
| 2180262 | 3/1987 | United Kingdom | 204/192.1 |

OTHER PUBLICATIONS

W. W. Anderson et al., *Proceedings, 2nd E.C. Photovoltaic Solar Energy Conf.* (1979), pp. 890–897.
Todorov et al., "Oxidation of Silicon by a Low-Energy Ion Beam: Experiment and Model", *Appl. Phys. Lett.*, vol. 52, No. 1, Jan. 4, 1988, pp. 48–50.
Schiller et al., "Alternating Ion Plating-A Method of High-Rate Ion Vapor Deposition", *J. Vac. Sci. Technol.*, vol. 12, No. 4, Jul./Aug. 1975, pp. 858–864.
Makous et al, "Superconducting and Structural Properties of Sputtered Thin Films of $YBa_2Cu_3O_{7-x}$", *Appl. Phys. Lett.* 51 (25), Dec. 21, 1987, pp. 2164–2166.
Schiller et al., "Reactive D.C. Sputtering with the Magnetron-Plasmatron for Tantalum Pentoxide and Titanium Dioxide Films", *Thin Solid Films*, vol. 63 (1979), pp. 369–375.
Schiller et al., "Advances in High Rate Sputtering with Magnetron-Plasmatron Processing and Instrumentation", *Thin Solid Films*, vol. 64 (1979), pp. 455–467.
Scherer et al., "Reactive High Rate D.C. Sputtering of Oxides", Paper presented at International Conference on Metallurgical Coatings, San Diego, Calif., Apr. 9–13, 1984.

*Primary Examiner*—Aaron Weisstuch
*Attorney, Agent, or Firm*—Flehr, Hohbach, Hohbach, Test, Albritton & Herbert

[57] ABSTRACT

A rotary cylindrical sputtering system incorporates separate, separately-controlled linear magnetron sputter cathode and reaction zones for sputter depositing materials such as refractory metals and forming oxides and other compounds and alloys of such materials. The associated process involves rotating or translating workpieces past the differentially pumped, atmospherically separated, sequentially or simultaneously operated cathode and reaction zones and is characterized by the ability to form a wide range of materials, by high throughput, and by controlled coating thickness, including both constant and selectively varied thickness profiles.

51 Claims, 7 Drawing Sheets

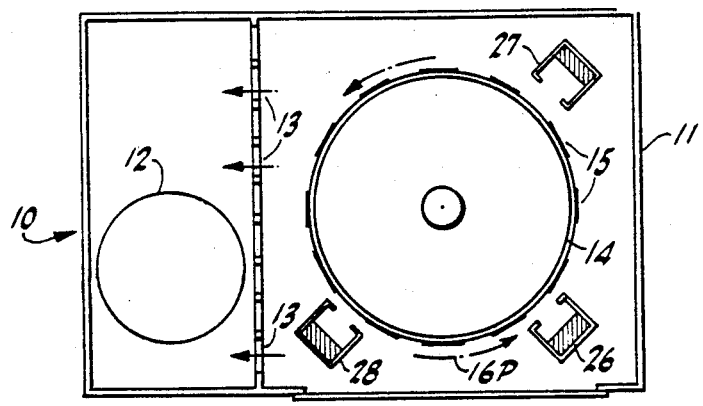
FIG-2
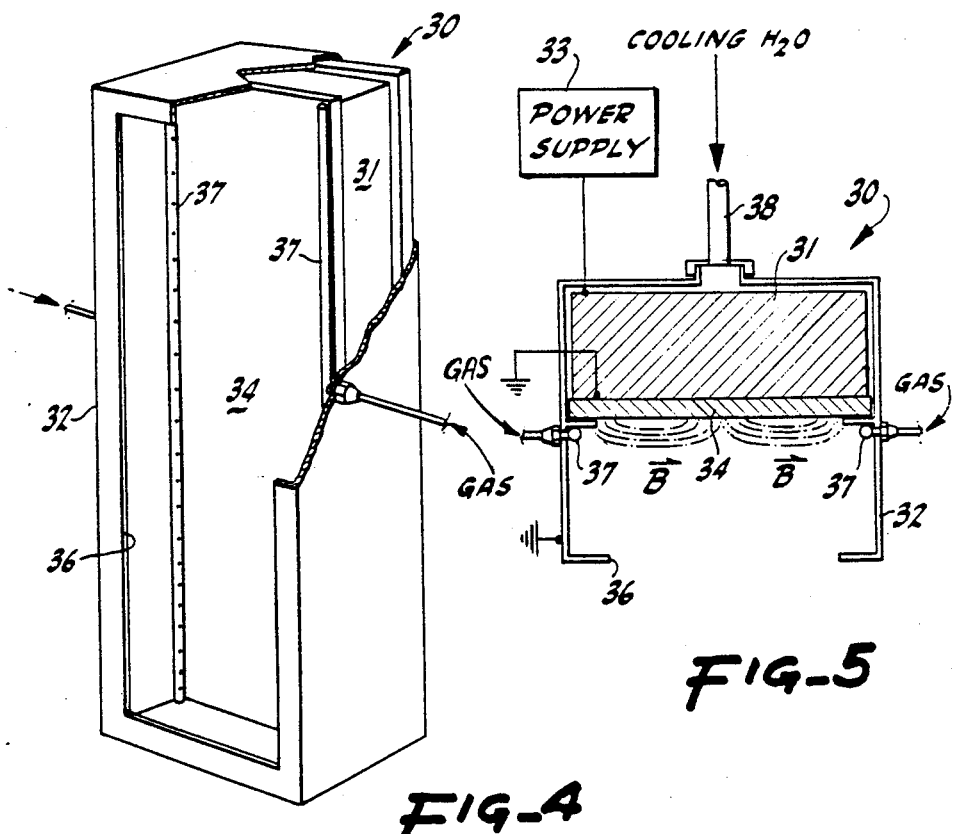
FIG-5
FIG-4

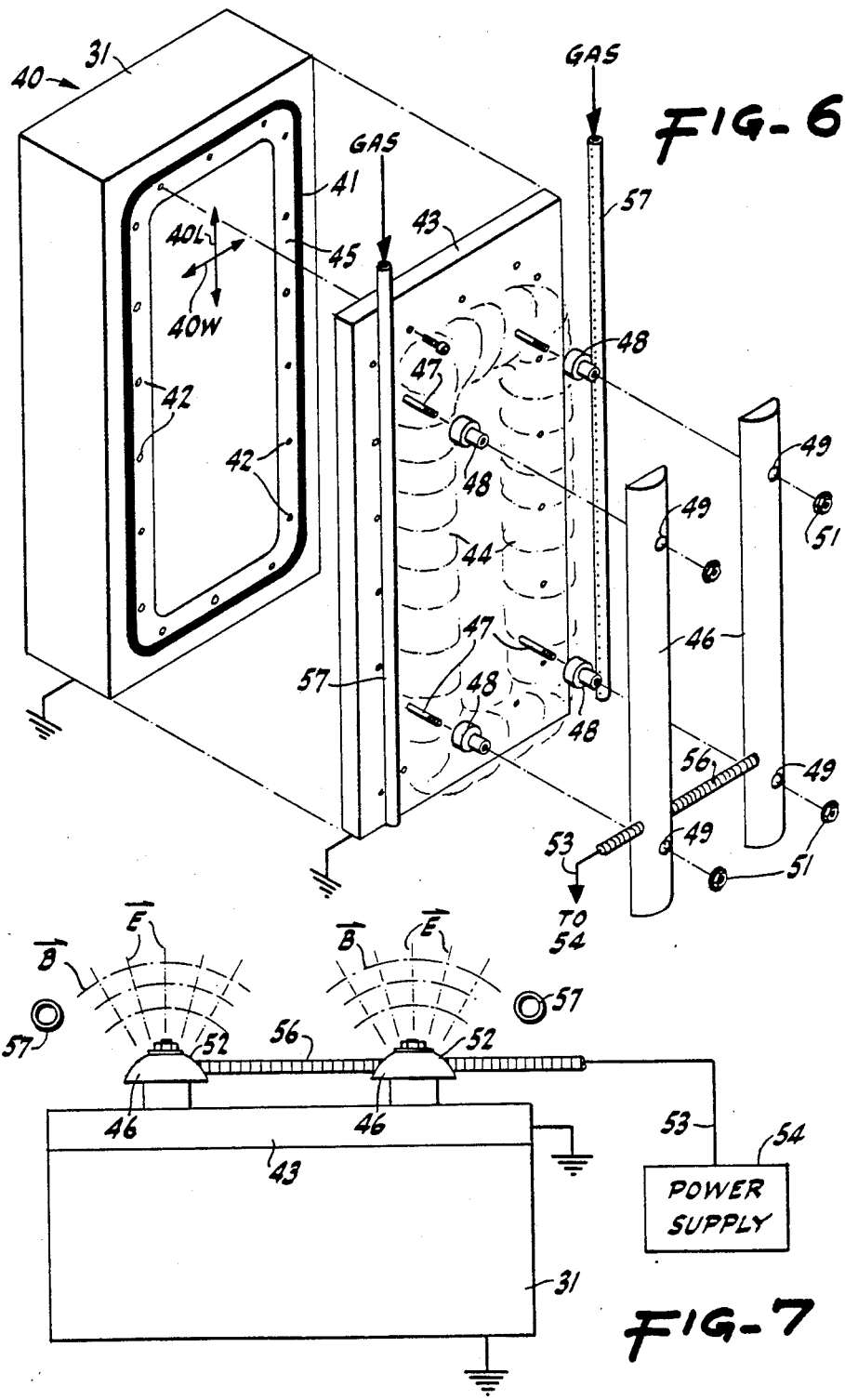

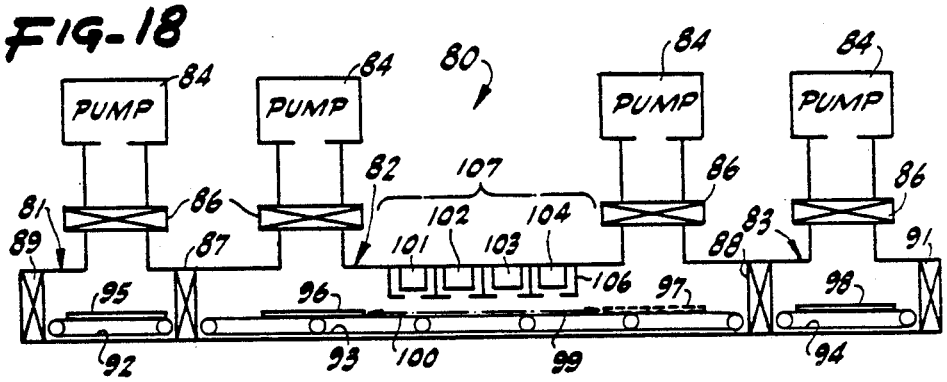
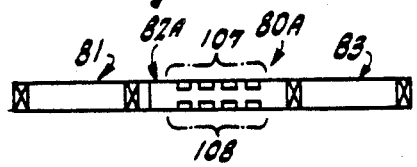
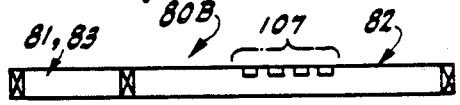
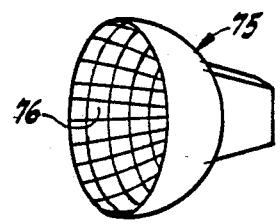

MAGNETRON SPUTTERING APPARATUS AND PROCESS

BACKGROUND OF THE INVENTION

The present invention relates to DC magnetron sputtering processes and related apparatus. More particularly, the present invention relates to apparatus and processes for high rate, uniform deposition and formation of thin films, such as refractory metals and/or oxides, nitrides, hydrides, carbon-containing compounds and other compounds and alloys of such metals, and also to the deposition and formation of composite films. Because the process and apparatus of the present invention are designed to satisfy the stringent requirements of optical coatings, they are applicable as well to a number of other coating applications having less rigorous requirements.

DESCRIPTION OF THE STATE OF THE CONVENTIONAL TECHNOLOGY

DC magnetron reactive sputtering has been developed in recent years as a technique for producing layers of dielectric materials, particularly metal oxides, and oxide semiconductors, particularly indium tin oxide. The technique has advantages compared with the RF magnetron techniques for sputtering dielectric materials directly in that deposition speed gains can be realized, and production equipment is less costly, safer, and easier to control.

It is the conventional wisdom in the coating technology that any process which seeks to take full advantage of the D.C. magnetron sputtering technique and to avoid its potential disadvantages must preferably use partial pressure separation of the substrate and sputtering cathodes. Several approaches have been proposed for implementing partial pressure separation. See, for example, Hartsough, U.S. Pat. No. 4,420,385; Schiller et al, "Advances in High Rate Sputtering with Magnetron-Plasmatron Processing and Instrumentation", *Thin Solid Films,* Vol. 64 (1979) 455–67; Scherer et al, "Reactive High Rate DC Sputtering of Oxides", (1984); and Schiller et al, "Reactive DC Sputtering with the Magnetron-Platatron for Titanium Pentoxide and Titanium Oioxide Films", *Thin Solid Films,* Vol. 63 (1979) 369–373.

The Scherer technique employs cathodes baffled in such a way as to create an oxidation zone located directly over the sputtering zone. In all other regards, this technique is not directly relevant to our invention as it is designed to deposit material in a single pass and also in that the oxidation of the metal vapor takes place as it is deposited. The Schiller and Hartsough techniques alternate a substrate between a sputtering cathode and a reactive gas sorbtion zone, which is the more effective technique for achieving pressure separation. The most complete description of this partial pressure technique is contained in the Hartsough patent. The Hartsough patent discloses the formation of non-optical quality wear-resistant aluminum oxide coatings on a disk by rotating the disk past a single sputtering deposition zone and a single oxidizing zone. The entire volume outside the sputtering zone is used as the reaction or oxidation zone, thus the boundaries of the two zones are in contact. Extremely tight baffling between the sputtering cathode and the substrate carrier is required to avoid migration of the reactive gas into the deposition zone. This limits the pressure available for oxidation. Also, the deposition rate available using this approach is inherently limited by the oxidation rate. That is, as the power to the cathode is increased to increase the metal sputtering rate, the table rotational speed must be increased so that the optimum thickness of material is deposited within the deposition zone. However, as the translational speed of the table is increased, the dwell time within the oxidation zone decreases proportionately, with the result that in the limit there is insufficient dwell time within the reaction zone to completely oxidize the metal layer.

The above-described partial pressure technique has at least three additional serious disadvantages. First, if one or more additional sputtering cathodes were required for the purpose of providing the capability to deposit other materials in the same apparatus in the same vacuum cycle, the reaction time per translation cycle would be proportionately reduced by the number of additional cathodes.

Second, the deposition rate for each material would be proportionately reduced. The technique as described permits only one reaction volume which is always effective and thus precludes the simultaneous deposition of two different metal oxides or other compounds or a pure metal and a compound.

Finally, the annular rotating arrangement with its requirement for a specially shaped magnetron sputtering target places severe restrictions on the achievable film thickness uniformity such that for optical thin film practice the useable portion of the apparatus described would be a narrow annular region.

It is obvious then that for the production of multi-layer optical filter devices in even modest commercial volumes the described prior art approach is unsuitable. Also, it can be shown that this approach because of the disadvantages described if applied to the practical production of multi-layer optical devices would have no greater throughput than a conventionally-operated RF Magnetron apparatus of the same size and configuration.

SUMMARY OF THE INVENTION

A. Characteristics of Deposition and Reaction Zones

A fundamental difference between our invention and the prior art is that with our invention both deposition and reaction are effected in long narrow axial zones adjacent the periphery of a moving substrate carrier. Our reaction is effected by a means of highly intense plasma in a highly efficient manner at high reactive gas pressures in a long narrow zone, isolated physically from the metal deposition zone by a region of relatively low pressure. Through the use of a reactive ion source configured to produce an elongated uniform high intensity ion flux adjacent the periphery of the carrier for generating an intense reactive plasma from oxygen or other reactive gas, such as the linear magnetron, or suitably configured ion gun, the high pressure reactive volume is substantially comprised of highly energetic gas species, which greatly shortens the time required for the reaction. A further resulting advantage of this technique, thus, is that the technique is not limited to reactive gases such as oxygen, for compounds can be formed using less reactive gas species such as nitrogen, hydrogen, gaseous oxides of carbon, etc., to form nitrides, hydrides, carbides, etc. The invention overcomes all of the above-mentioned disadvantages of the prior art and affords further advantages in that considerable deposition speed increases can be realized through the use of multiple stations. The available reactive gas pressures and deposition rates are well above the practically attainable deposition rates using prior art equipment. Curved substrates can also be coated due to the elimination of the requirement for tight baffling.

In this application, we provide examples of applications which highlight the practical value of the fundamental differences between our invention and the prior art.

B. Present System and Operation

In a presently preferred approach for forming thin film coatings including refractory metal coatings and optical quality dielectric coatings such as metal oxide coatings, our invention uses an in-line translational processing configuration, or a cylindrical processing configuration in which substrates are mounted on a rotating cylindrical drum carrier, or on a rotating planetary gear carrier, or on a continuous moving web. The substrates are moved past a set of processing stations comprising (1) at least one preferably linear cathode plasma generating device (e.g., a planar magnetron or a Shatterproof rotating magnetron) operating in a metal deposition mode for depositing silicon, tantalum, etc., alternated or sequenced with (2) a similar device such as a planar magnetron operating in a reactive plasma mode, or an ion gun or other ion source configured to produce an elongated uniform high intensity ion flux adjacent the periphery of the carrier, for generating an intense reactive plasma, using oxygen or other reactive gases including but not limited to nitrogen, hydrogen or gaseous oxides of carbon. The arrangement provides long narrow zones for both deposition and reaction with complete physical separation of the zone boundaries. When similar magnetron cathodes are used, one is operated using a relatively low partial pressure of the reactive gas (such as oxygen) to provide the metal deposition mode while the other is operated at a relatively higher reactive gas partial pressure to generate the intense reactive plasma for oxidation, etc.

The substrates and cathodes may be located inside or outside (or both) the drum. Also, the arrangement is scalable in that a multiple number of cathodes/ion guns can be used in each processing station set to increase the deposition rates and the number of materials formed. Various processing station arrangements can be provided in a chamber for depositing and oxidizing different metals separately, sequentially or simultaneously. As one example, four stations can be selectively arranged and sequentially operated to perform the sequence: tantalum deposition, oxidation, titanium deposition and oxidation, to quickly form alternating layers of $Ta_2O_5$ and $TiO_2$.

In our process, the relationship between the power of the deposition cathodes and the speed of rotation or translation of the substrate can be tailored so that in each pass, a deposited thickness of one or more atomic layers can be obtained. By adding additional cathodes of other materials, and by adjusting the power to each cathode, effectively alloys can be created of any desired ratio. For example, NiCr can be formed in any desired ratio from cathodes of Ni and Cr, over large areas, simply by adjusting the relative power to the cathodes. By adding oxidation stations, one can form complex oxides such as barium copper yttrium oxide, forms of which are known to be superconducting.

C. Summation of Certain Practical Advantages of the Present System

The cylindrical rotating geometry used in our sputtering system combined with the linear/planar magnetron sputtering stations and reactive plasma stations provide fast, uniform deposition of optical quality coatings on large volumes of both flat and curved parts. Parts such as tubes or polygons can be coated uniformly around the entire periphery thereof by incorporating a double rotating, planetary gear mounting arrangement. Additionally, we have deposited uniform coatings onto complex shapes such as lamp glass envelopes. Also, the application of the sputtering stations and reaction stations to translational systems provides fast, high throughput, uniform deposition of optical quality coatings on large flat substrates such as glass panels. The efficiency of the metal mode deposition in providing high deposition rates for a given power input coupled with the spreading of the deposit and heat over a large number of substrates/large drum surface area provides a unique combination of high deposition rates and low substrate heating which permits the high rate formation of coatings on even plastics and other low melting temperature materials.

To provide a basis for comparison, conventional DC reactive oxide sputtering processes provide oxidation rates $\leq 10$ Angstroms/second off the target, while our process provides formation rates of about 100–150 Angstroms/second for $Ta_2O_5$ and about 100 Angstroms/second for $SiO_2$.

In one specific aspect, our invention eliminates a major difficulty associated with the prior art vacuum deposition of multilayer and single layer thin films on spherical, curved and non-uniform, unconventional shaped substrates, by reproducibly forming on such substrates durable, high-quality coatings having controlled thickness profiles of selected uniform or variable thickness. Previously, various techniques have been used in attempts to overcome the difficulties in achieving controlled deposition on curved and flat surfaces. For example, others have attempted to solve uniformity problems using either a multiple rotation of the substrate coupled with introducing an inert gas to "scatter" the cloud of depositing material or using a masking technique in which equalization of the deposition rate on the part is accomplished by shadowing high rate regions to match low rate areas. Durability problems associated with the high deposition angle of incidence on curved surfaces can be solved by masking high angle regions. However, these strategies have significant difficulties. For example, scattering is limited to $ZnS/MgF_2$ materials, which produce porous, soft coatings with poor abrasion and temperature durability. Hard coating materials such as metal oxides, when thermalized, suffer from reduced indices of refraction and poor film durability when made using the evaporation process. Masking increases coating chamber tooling complexity, especially for curved surfaces and complex curved surfaces such as bulbs, and reduces deposition rates.

As suggested above, our invention overcomes these problems by using a simple axial rotary motion coupled with our high rate reactive sputtering scheme. Axial rotation produces uniformity along the equatorial axis and the inherent high pressures associated with sputtering provides a gas scattering effect for polar uniformity. The higher energies of the sputtered atoms are sufficient to overcome the thermalizing effects of the gas scattering and the films exhibits good durability. High rates are achieved by using the unique reactive sputtering scheme described above in which the substrates such as (but not limited to) bulbs are rotated alternately through a high rate metallic sputtering zone and an energetic reactive plasma. This combination of rotating cylindrical geometry, and planar magnetron deposition and reaction technology (or, more specifically, planar magnetron and reactive plasma technology) accomplishes the desired result: providing reproducible, highly durable, optical thin film coatings deposited at high rates and with controlled uniformity on a large surface area and/or a large number of flat or spherical or other curved substrates, including unconventional substrates formed to a complex curvature and/or formed of low melting point materials.

It is emphasized that, as used here in reference to the present invention, the phrase "controlled thickness profile" or "controlled uniformity" comprises not only the ability to deposit coatings of precisely uniform thickness on flat or curved surface, but also the ability to vary in a controlled fashion the thickness of a coating deposited along a concave curved surface, to achieve desired design objectives such as spectral performance.

BRIEF DESCRIPTION OF THE DRAWINGS

The above and other aspects of the invention are described with respect to the drawings in which:

FIGS. 1 and 2 are, respectively, a simplified schematic perspective view and a simplified schematic horizontal sectional view, both of a single-rotational cylindrical drum magnetron-enhanced vacuum sputtering system which embodies the principles of our present invention;

FIGS. 4 and 5 are, respectively, a simplified schematic perspective view, partially cut away, and a simplified schematic horizontal cross-sectional view of one type of DC linear magnetron sputtering device used in the magnetron-enhanced vacuum sputtering system of the present invention;

FIGS. 6 and 7 are, respectively, an exploded perspective view and an end view, partly in schematic, of one embodiment of a linear magnetron ion source used in the magnetron-enhanced vacuum sputtering system of the present invention;

FIG. 17 depicts the type of deep dish glass lamp reflector on which reflected multi-layer coatings having the transmittance charateristics evidenced in FIG. 11 were formed using the present invention; and FIGS. 18-21 depict alternative embodiments of in-line magnetron-enhanced vacuum sputtering systems which employ separate sputtering source and reaction zones in accordance with the present invention.

DESCRIPTION OF THE PREFERRED EMBODIMENT(S)

A. Single and Double Rotation, Rotary Systems

Our present invention combines linear DC magnetron sputtering cathodes operating in a partial pressure separation regime and rotary cylindrical workpiece transport to provide a sputter deposition system which is capable of high rate formation of single or multi-layer optical films of materials such as, but not limited to, $SiO_2$, $TiO_2$ and $Ta_2O_5$. This combination is achieved despite the previous incompatibility of linear magnetron sputterers and rotary workpiece transport and despite the inherent difficulty (as evidenced in the prior art) in implementing partial pressure separation.

Figure 1:
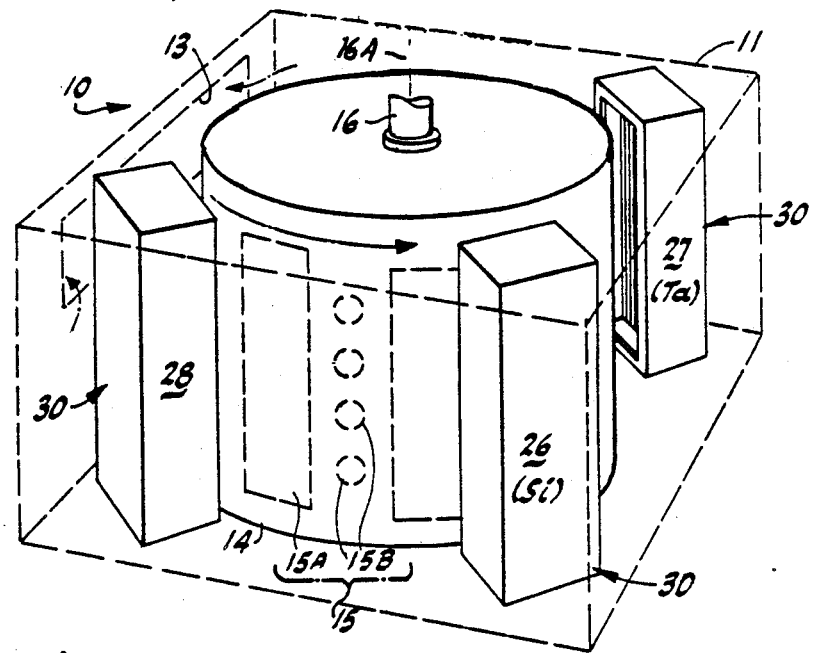

FIGS. 1 and 2, respectively, depict a simplified schematic perspective view and a horizontal sectional view of a single rotation embodiment of our magnetron-enhanced vacuum sputtering system. The illustrated sputtering system 10 comprises a housing 11 which forms a vacuum processing chamber and is flanked on opposite sides of and connected to a suitable vacuum pumping system 12 shown in FIG. 2. The vacuum pumping system includes a cryopump or other suitable vacuum pump or combinations thereof for exhausting and pumping down the vacuum chamber via exhaust port 13. The system 10 also includes a cage-like drum 14 which is mounted for rotation about shaft 16 and has a cylindrical side which is adapted for mounting substrates 15 of various configurations and sizes. The substrates 15 can be mounted directly on the drum 14, facing outwardly toward sputtering stations which are spaced about the external periphery of the drum or facing inwardly toward sputtering stations spaced along the internal periphery of the drum.

Figure 3:
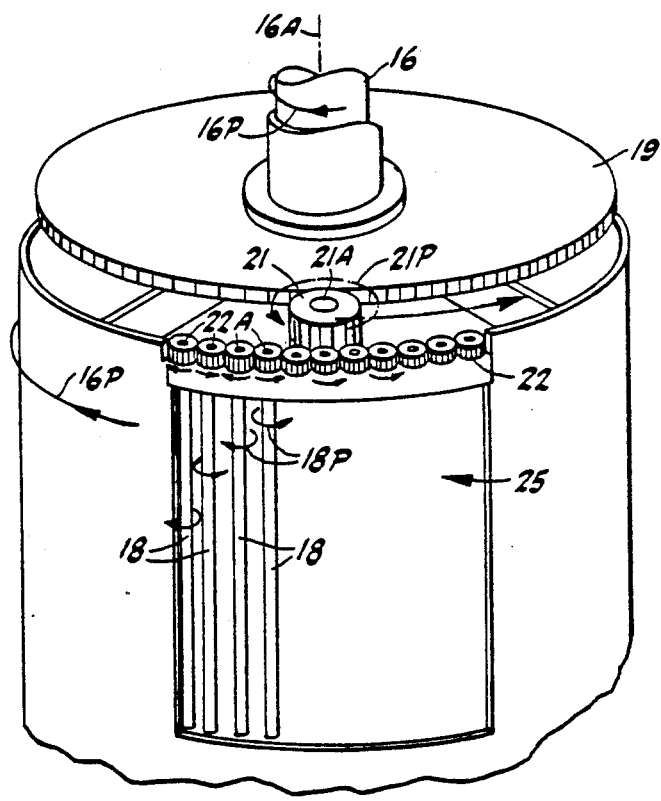
FIG. 3 is a simplified schematic perspective view of a double-rotational, cylindrical drum embodiment of a magnetron-enhanced vacuum sputtering system embodies the principles of the present invention.

Alternatively, and referring to FIG. 3, the system 10 may incorporate one or more double rotational motion planetary gear mounting arrangements 25, either in conjunction with or as a replacement for the drum 14. The double rotation planetary gear arrangements can be provided on the drum alone or in combination with the single rotation substrate mounting positions 15. The planetary gear arrangement mounts and imparts double rotational motion to articles such as tubes 18. The planetary gear system 25 may comprise a sun gear 19 which is driven by shaft 16. Alone or in conjunction with a ring gear (not shown), the sun gear 19 rotates the associated planet gears 21 about their own rotational axes 21A as well as about the sun gear's rotational axis 16A. In the illustrated embodiment, the planet gear 21 is operatively connected to a train of gears 22 which are mounted on shafts for rotation about their axes 22A. In turn, the tubes 18 are mounted on and rotate with the planet gear support shafts about axes 22A. As a consequence of this planetary gear mounting arrangement, rotation of drum 14 and sun gear 19 along reversible path 16P about axis 16A rotates planet gears 21 along path 21P about axis 21A, which is converted by the gear train into alternating rotation of tubes 18 along paths 18P about axes 22A. This double rotary motion of the sun gear 19 and the planetary gears 21 enhances the ability to coat articles such as tubes uniformly about their entire circumference.

Referring further to FIGS. 1–3, in the illustrated embodiment, a plurality of magnetron-enhanced sputtering devices, designated generally by the reference numeral 30, are positioned about the outer periphery of the drum 14. In one exemplary embodiment, the station designated 26 is used to deposit material such as silicon whereas station 27 deposits a different material such as tantalum and station 28 is used to react a gas such as oxygen with the substrates to convert the deposited metal layer(s) to oxide. Thus, by rotating the drum 14 and selectively operating the sputtering and reaction stations 26, 27 and 28, the metals and/or oxides thereof can be selectively formed on the substrate in essentially any desired combination. For example, by rotating drum 14 and sequentially activating the cathodes in the sequence 26, 28, 27, 28, system 10 can form a silicon layer a few atoms thick and oxidize the silicon to $SiO_2$, then deposit a layer of tantalum a few atoms thick and oxidize the tantalum to $Ta_2O_5$. This sequence can be repeated and altered as required to form a composite optical coating of layers of $SiO_2$ and $Ta_2O_5$ of precisely controlled thicknesses. It should be noted that oxidation stations 30 such as the one at station location 28 can use a planar magnetron cathode similar to deposition stations 26 and 27, by substituting oxygen for the argon; or can use other ion sources capable of generating a reactive ionized plasma, such as ion guns or the linear magnetron ion source described below, or other devices which generate the required reactive DC or RF plasma.

B. DC Magnetron Sputter (and Reaction) Devices

FIGS. 4 and 5 schematically illustrate one type of DC magnetron sputtering device 30 which is commercially available from VacTec or other suppliers and can be used at station locations 26 and 27 and, optionally, at station 28, FIGS. 1 and 2. The sputtering device 30 comprises a housing which mounts a cathode 31 and forms a front, reactive gas baffle 32 having an opening 36 which is selectively closed by shutter (not shown). Cathode 31 is connected to a power supply 33 for applying a voltage of, e.g, $-400$ v. to $-600$ v. to the cathode relative to the baffle 32, which is at anode potential (usually ground). Permanent magnets (not shown) are mounted within the cathode body for supplying a magnetic field B of rectangular racetrack configuration along the surface of the target 34 and perpendicular to the applied electric field. Manifold tubes 37 are situated adjacent the target 34 and are connected to a source of gas for supplying reactive gas such as oxygen or an inert working gas such as argon to the sputter chamber defined by baffle 32 and target 34. The device is cooled by water which is supplied via inlet 38 and circulated to an outlet (not shown). The baffles 32 in the individual sputter devices 30 effectively divide the overall processing chamber 10, FIGS. 1 and 2, into different regions or sub-chambers at each sputterer in which different gas atmospheres and/or gas partial pressures can be established. Improvements could be readily implemented where one or more additional pumps could be placed to improve separation between regions of reactive and non-reactive gases.

Compounds, etc., such as oxide dielectric films can be formed using the linear magnetron sputter devices 30 at the sputter stations 26 and/or 27 and using a different type of device, such as the ion source 40 which is described in the next section, at reaction station(s) 28. Alternatively, one can use at least two baffled linear magnetron sputter devices 30 at the sputter stations 26 and/or 27 and at the reaction station 28. In both cases, the sputter device and the ion source device are enclosed in distinct partial pressure regimes or chamber regions between which the substrate is alternated by the continuously rotating drum. When baffled magnetron cathodes 30 are used both to sputter and to oxidize, the cathodes are operated at relatively high power density in an oxygen ambient within chamber 10 using a target designed for sputtering the selected metal such as silicon or tantalum. However, the baffle-separated magnetron cathodes which are used at stations 26 and 27 for metal deposition are operated in a low reactive gas (oxygen) partial pressure environment for operating in a metal mode and depositing metal at consequentially high rates. The low oxygen partial pressure is supplied by flowing inert working gas such as argon into the chamber area via manifolds 37. The other type of baffled magnetron cathode 28 is operated at relatively higher reactive gas partial pressure and sputter deposits the metal at a much lower rate on the moving substrates but oxidizes the metal at a much higher rate. The lower rate target adds little to the overall deposition rate and thus does not affect control, but does produce a highly reactive plasma which allows the chamber oxygen to readily react with the growing thin film and, as a result, permits the use of a relatively low overall chamber oxygen partial pressure, which enhances cathode stability and rate. This reactive sputtering approach provides repeatable thin films deposited at high rates, fully oxidized and with good optical qualities.

C. Linear Magnetron Ion Source

FIGS. 6 and 7 depict a presently preferred embodiment of a linear magnetron ion source 40 which is used at reaction station(s) 28, FIGS. 1–3 to provide the desired narrow elongated reaction zone. The linear magnetron ion source 40 uses electrons associated with the sputtering plasma to generate ions from a reactive gas in a separate local plasma. These ions bombard the sputter-deposited material on the substrates and thus form compounds with the sputtered material. The ion source 40 can use the cathode assembly 31 and the housing 32 shown in FIGS. 4 and 5 (for clarity, housing 32 is deleted in FIGS. 6 and 7). As adapted for use as a linear magnetron ion source, direct-cooled cathode 31 includes an O-ring seal 41 and tapped holes 42 in the face to insulatingly mount a non-magnetic stainless steel cover plate 43 in place of target 34 to seal water circulation channel 45 in the cathode body. As mentioned previously, cathode 31 also incorporates permanent magnets (not shown) which provide a magnetic field B of elongated rectangular "race track" configuration 44 along plate 43 when the plate is assembled to the cathode. The ion source 40 is mounted adjacent the periphery of the rotatable substrate carrier 14 with its long direction or axis 40L parallel to axis 16A of the carrier 14, FIG. 1, and the width or short axis 40W parallel to the circumference and the direction of rotation 16P, FIG. 3, of the carrier.

A pair of stainless steel bar anodes 46—46 are mounted along the elongated opposite sides of the magnetron race track 44 on posts 47 which themselves are mounted to the non-magnetic plate. The anodes 46 are insulated from the posts 47 and plate 43 by stepped insulator stand-offs 48 having relatively small sections which extend into holes 49 in the bar anodes 46 and larger bottom sections which serve to precisely space the anodes from the stainless steel plate 43, as shown in FIG. 7. For mounting, the posts 47 are inserted through the stand-offs 48 and through the holes 49 in the bar anodes 46, and are secured by nuts 51.

Each anode 46 is a straight bar which is slightly shorter than the long side of the magnetron race track 44. Each anode's curved, generally cylindrical outer-facing surface 52 conforms closely to the shape of the magnetic field lines, B, FIG. 7. The anodes 46 are connected through wire leads 53 to a conventional power supply 54 capable of providing several amps current at, for example, +50 volts to +140 volts bias. Preferably, insulating beads 56 (or other suitable insulation) are mounted along the section of the leads 53 within the housing to isolate the leads from the plasma and prevent discharge at the wire. Typical operation is at 2 to 4 amps and 100 to 120 volts for a nominally twenty inch long magnetron cathode.

As mentioned, the mounting location or station of the linear magnetron ion source 40 is outside the sputtering region(s) 26 or 27 but within the associated plasma, which extends essentially throughout the vacuum sputtering chamber. In operation, the power supply 54 is used to maintain the stainless steel bar anodes 46 at a positive DC voltage of, for example, 100 to 120 volts relative to the cathode 31 and the stainless steel plate 43, which are at system ground and at an even greater positive potential with respect to electrons in the surrounding plasma. As shown most clearly in FIG. 7, the curved surfaces 52 of the anodes provide electric field lines E which are substantially perpendicular to the magnetic field lines B. Electrons in the associated plasma are accelerated towards the positive anodes 46 and are trapped or confined by the resultant E×B field along the magnetron race track, greatly enhancing the probability of collisions with the reactant gas supplied via adjacent inlet manifolds 57, and thereby generating an intense plasma defined by the race track configuration 44. That intense plasma generates many ions from the reactant gas which are accelerated away from the anodes 46 by the potential gradient existing between the anodes and the background plasma and toward the substrates to enhance the reaction process, e.g., to enhance oxidation of sputtered metals using oxygen as the reactant gas.

In short, during operation, the elongated inverse linear magnetron ion source 40 provides an intense long narrow reaction zone defined by the magnetron race track 44 to have the long dimension thereof spanning substantially the height of the substrate carrier drum 14 and the narrow dimension thereof defined along the circumference of the carrier parallel to the direction of rotation. In distinct contrast to the prior art's requirement that substantially the entire volume outside the single sputtering zone be used for oxidation, in the current version, our ion source 40 has a reaction zone which is only about approximately five to six inches wide and occupies a small fraction of the circumference of the 29 inch diameter drum 14 ($5''\pi D=5''/91''=5.5\%$), yet due to the intense magnetic field-enhanced plasma reaction, completely oxidizes the deposited thin film in, typically, a single pass. The small ion source cathode size and the fast reaction rate provide unique upward scaling capability, enabling the use of a multiple number of sputtering cathodes and oxidation reaction cathodes to provide high rate, high volume, high throughput deposition and versatility in the selection of the composition of the deposited coatings.

The combination of the rotatable drum and baffled magnetron-enhanced sputtering and reaction cathodes has provided high rate, precisely controllable optical quality metal and dielectric layers in thicknesses which are scalable, on both flat, curved and irregularly shaped substrates with a minimum of masking. Also, because a given layer is built up by a multiplicity of coating passes, the effects of cathode arcs are greatly decreased since any such arc represents only a portion of the coating. Additionally, when operating in the metal mode, magnetron arcs are typically less frequent and intense.

The process described above involves sputtering metal materials such as, but not limited to, silicon, tantalum, titanium, iron or any other sputterable material that forms stable oxides in an atmosphere that permits the target to operate in the metal mode, characterized by the highest rate of sputtering, while elsewhere in the machine establishing an ion process which preferably uses magnetron-enhanced sputtering to expose the freshly deposited film to a reactive atmosphere that converts it to an oxide. The metal preferably is deposited no more than a few atoms thick in order that the oxidation during the subsequent reaction process is complete. Typically, the process of sputter deposition, oxidation, sputter deposition, oxidation is repeated as required to build up the oxide layer to the desired thickness of material such as $SiO_2$. Then if a different layer such as $Ta_2O_5$ is to be formed the same repetitive process is repeated. Quite obviously, various oxide forming cycles and metal deposition cycles can be applied as required to form composites of oxides alone, oxides and metals, or metal(s) alone.

As mentioned above, a locally intense ionized reactive plasma from an ion source such as an ion gun or a planar magnetron is used to provide the oxidizing reaction. The uniformity of the magnetron sputter-deposited metal films is precise, and the cylindrical geometry allows uniform distribution of sputtering materials. Thus, it is possible to use time and power control of the process in almost any width or length of cathode, thereby overcoming the historical problems of controllability, scalability and throughput associated with conventional DC magnetron reactive processes. As demonstrated in the examples below, this ability permits precision deposition of fractional optical layers such as one-sixteenth visible wavelength optical layers which are difficult to deposit using conventional vacuum evaporation processes.

D. Alternative Rotary Cylindrical Systems

Figure 8:
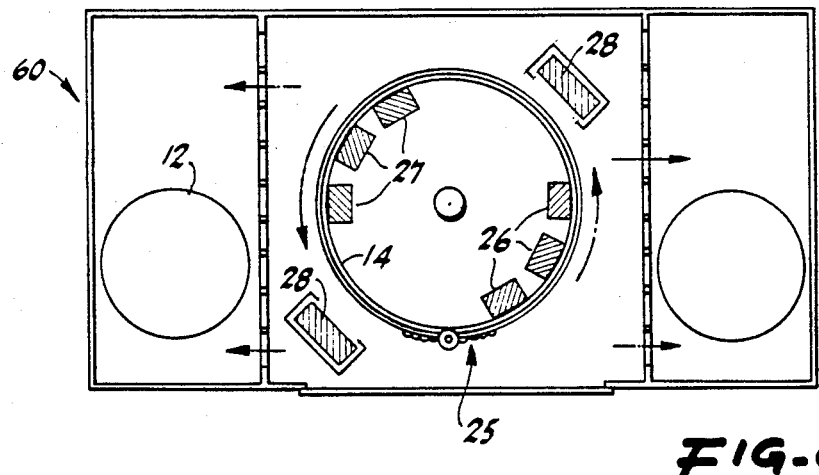
FIGS. 8 and 9 are simplified schematic horizontal sectional views of alternative rotational cylindrical drum embodiments of our system.

FIG. 8 depicts an alternative sputtering system 60 which comprises a pair of cryopumps 12—12 situated on opposite sides of the vacuum sputtering chamber, a plurality of silicon sputtering devices 26 and tantalum sputtering cathodes 27 formed on the inside of the drum 14 facing outwardly and interspersed oxidizing devices 28 situated on the outside of the rotating drum 14 facing inwardly. The illustrated system incorporates a planetary gear substrate mounting and drive arrangement 25 for uniformly exposing the periphery of work pieces such as tubes to both the internal and external sputtering stations. By virtue of this arrangement, and the multiple silicon, tantalum and oxygen cathodes, the silicon and tantalum layers and the oxidation of said layers can be done at a high rate on a large number of substrates. For example, a composite layer comprising $SiO_2$ and $Ta_2O_5$ can be formed by operating the silicon cathodes 26 simultaneously, then operating the upper right oxygen cathode 28, followed by operating all of the tantalum cathodes 27 simultaneously, then operating the lower left oxygen cathode 28.

Figure 9:
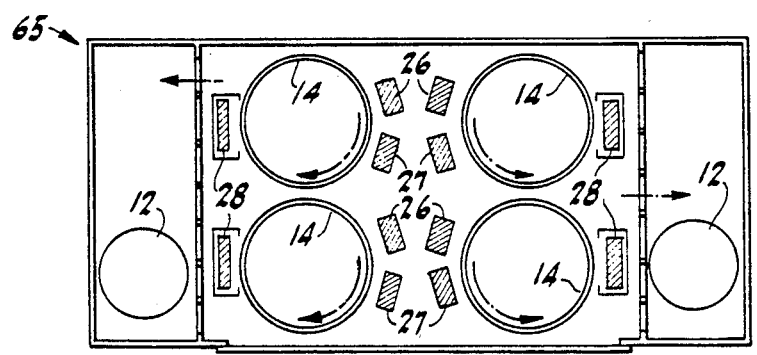

Still another alternative embodiment of our vacuum sputtering system is shown in FIG. 9. Here, the illustrated system 65 comprises a pair of vacuum pump systems 12 and four rotating drums 14, each of which is served by an external array of a silicon cathode 26 and a tantalum cathode 27 and an oxygen cathode 28.

Figure 10:
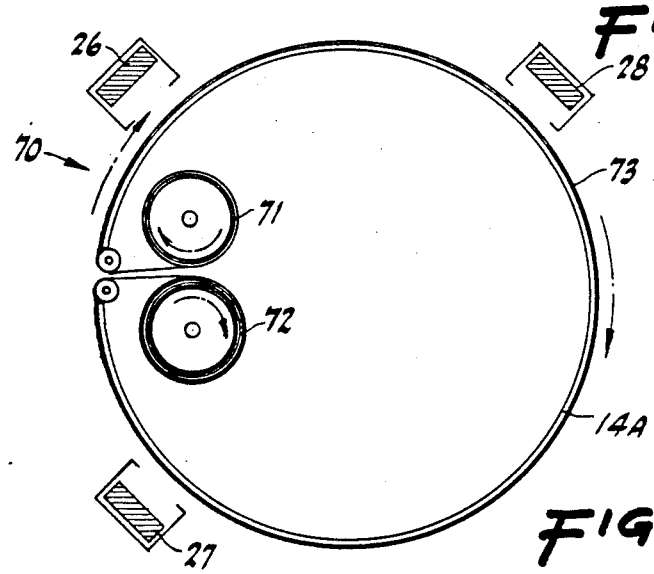
FIG. 10 is a simplified schematic representation of another alternative embodiment of the present cylindrical, rotary magnetron-enhanced vacuum sputtering system, one in which a web is fed incrementally or continuously to the drum and substrates are mounted on the web for processing or, alternatively, the surface of the web is itself processed.

FIG. 10 illustrates still another version 70 of the possible embodiments of our rotary magnetron sputtering system, one which adapts our linear magnetron sputtering approach to a continuous or incremental sheet or roll. This arrangement 70 provides high rate, tailored single or multiple layer sputtering deposition without the problems of temperature build up and low deposition rates which have hindered prior attempts to deposit materials such as dielectrics on rolls of flexible substrate.

The continuous roll coating arrangement 70 employs a rotating drum 14A, an internal unwind roll 71 and an internal take-up roll 72 for cooperatively unwinding the flexible sheet or web 73 of material from the unwind roller, advancing the flexible web 73 intermittently or continuously about the circumference of the drum 14A past linear magnetron sputtering stations, and taking up the flexible web on the internal roll 72.

This continuous roll coating arrangement 70 can be used to form coatings on the flexible web 73 itself or on substrates 15 which are mounted on the web. In addition, at least several modes of operation are possible. For example, one can sputter deposit or oxidize one layer at a time along the entire length of the web 73 by continuously/intermittently advancing the web and operating the selected sputter station or group of sputter stations to deposit the selected material or oxidize the previously deposited material. To form a multiple layer composite film, the web is then rewound and the process is repeated as required to obtain the desired thickness of the individual layer or multiple layers.

Secondly, one can coat entire sections of the web at a time up to a length which does not exceed the circumference of the drum 14A. To do this, the web is indexed to present the desired section of the web 73 to the appropriate sputtering station or group of sputtering stations, then the sputtering or oxidation operation is performed on that selected section. The web is then indexed to present another section to these or a different group of sputter stations. Quite obviously, this approach affords an essentially unlimited number of combinations for depositing or forming different layers, including dielectric layers, on different sections or substrates.

The continuous roll/web coating arrangement 70 quite obviously provides the previously discussed ability of our magnetron sputtering arrangement to coat single and multi-layer composites of sputterable materials (including metals) and oxides and extends that ability to large area continuous roll coating technology.

In still another application, the roll used in the previously described cylindrical sputtering system can incorporate tooling that flips or rotates substrates during a run to extend the capacity of the coating machine. The possibilities include the use of parallel banks of substrates which are rotated 180° to present substrates in each bank to the sputtering stations or separate drum or multiple-sided support bodies which are, for example, of triangular or other polygonal cross-section and are rotated by a planetary gear arrangement to present the faces or the entire circumference to selected sputtering stations. Also, the supports can be mounted about an axis parallel to the drum axis for rotation under computer control to selectively present substrates to the work stations.

E. Controlled Varied Coating Thickness Profiles on Concave Substrates

As described above and evidenced in several of the following examples, our sputtering invention provides a constant coating thickness along flat and curved substrate surfaces. Furthermore, the ability to precisely control the coating thicknesses encompasses the selective variation of coating thickness along curved concave substrate surfaces such as, for example, lamp reflectors.

In most practical applications involving optical coatings on concave reflector substrates, the film thickness must be precisely tailored over the radial (center to edge) direction to adjust the spectral response of the multi-layer device to the angle in which light from the bulb (filament) is incident on the mirror surface. The profile can be defined as the ratio of two wavelengths for a given spectral feature measured on the edge and on the center of the reflector. The ratio of these two wavelengths gives a figure of merit for the film profile called the E/C ratio. This ratio has been used to study the influence of key variables on the film thickness profile and to optimize the profile across the surface of the substrate.

A typical value for this profile or E/C ratio is 1.05. This means that the film stack thickness must be gradually increased to provide an edge thickness which is five percent greater than the thickness at the center. In our sputtering process, the film thickness over the surface of the steeply curved reflectors is governed by the following parameters:

1. The process total pressure;
2. The mass of the target material;
3. The mass of the working gas;
4. The target-to-substrate distance;
5. The eccentricity of the substrate;
6. The target power; and
7. The uniformity of the sputtering conditions.

For example, decreasing the total pressure decreases the E/C ratio; decreasing the mass of the target material increases the E/C ratio; and increasing the focal length of the reflector increases the E/C ratio.

We have studied the combined effect of process parameters using a statistical optimization program, XSTAT. This program was used to arrive at a prediction equation for a given film characteristic in terms of the sputter deposition parameters. E/C was included as one of the film characteristics. The resulting prediction equation is:

$$E/C = (0.6554) \, TD + (0.25) \, IGC - (0.91) \, PWR +$$
$$(0.006) \, OXY - (0.008) AR - 5.4, \text{ where}$$

$TD$ = target distance $IGC$ = ion gun current $PWR$ = target power

OXY = oxygen flow, and

AR = argon flow.

Using our sputtering process and the single rotation system depicted, for example, in FIGS. 1–3, all of the above parameters can be controlled with an extremely high degree of uniformity, allowing thickness profiles to be predicted and tailored to a degree which would be lost in the random variations and inherent non-uniformities of the prior art processes. Example 1 below demonstrates this ability to provide a controlled varying thickness profile on concave substrate, while Examples 2–6 demonstrate the ability to form uniform constant thickness coatings on flat and other curved substrates.

F. Summary of Rotary System Operation

Prior to considering specific examples, it is helpful to review the sequential steps used in our presently preferred method of operating the rotary magnetron sputtering apparatus. Because the examples described below were obtained using the single and double rotational apparatus depicted in FIGS. 1–3, the method of operation is keyed to this apparatus and to revised embodiments of this apparatus which use four (or more) metal sputtering and oxidation/reaction stations.

Initially, the reflectors or tubes or other substrates are mounted on the periphery of the drum. The vacuum enclosure/chamber is then pumped down to a background pressure of, for example, $1 \times 10^{-6}$ torr and rotation of the drum at the selected speed is initiated.

Next, the metal sputtering cathodes which are to be used during a selected coating sequence are started up by flowing the sputter gas, illustratively argon, through the inlet manifolds 37 and applying power to the cathodes 31 via associated power supplies 33. Prior to the initiation of the deposition/(deposition plus oxidation) coating cycle, the cathode shutters are kept closed to prevent deposition.

Once the operation of the sputter cathodes has been initiated, operation of the ion source or ion sources 40 is started. As mentioned, operation of ion source 40 utilizes the plasma associated with the operation of the sputter cathode(s) 30 and, thus, requires prior operation of the sputter cathode. Certain other ion sources, such as the sputter cathode 30 operating in an oxidizer mode, do not depend upon a separate plasma for operation but it is preferable not to start even these devices until operation of the sputter cathode has stabilized. Operation of the ion source(s) is initiated by applying the inlet flow of oxygen or other desired reactant gas or mixtures thereof via the inlet manifolds 57 and by applying power via power supply 54.

With the sputter cathodes and ion source cathodes established at stable operating conditions, that is, at stable selected power, gas flow and pressure and with the drum operating at the specified rotational speed to provide selected deposition and oxidation rates, the desired deposition and oxidation sequence is effected by selectively opening the shutters. For example, and assuming that four sputter and oxidation stations are positioned around the periphery of drum 14 in the sequence metal 1 cathode, ion source oxidizer, metal 2 cathode and ion source oxidizer, the following coatings can be attained by the associated shutter opening sequence:

1. Metal 1 deposition, oxidation, metal deposition, oxidation→metal 2 oxide on metal 1 oxide;

2. Metal 1, metal 2, oxidation→metal 2 oxide on metal 1;

3. Metal 1, oxidation, metal 2 metal→metal 2 on metal 1 oxide;

4. Metal 2, metal 1, oxidation→metal 1 oxide on metal 2;

5. Metal 2, oxide, metal 1→metal 1 on metal 2 oxide;

6. Metal 1 and metal 2 simultaneously (i.e., the shutters for the metal 1 cathode and the metal 2 cathode are opened simultaneously)→a layer which is a mixture of metal 1 and metal 2; and 7. Metal 1 and metal 2 simultaneously, oxidation→an oxidized mixture of metal 1 and metal 2.

Quite obviously, an essentially unlimited number of combinations of multi-layer coatings can be formed of various materials and using a multiplicity of cathodes.

Please note, during the formation of mixtures of two or more metals and/or other materials, preferably the sputter shutters are maintained open and the ratio of one material to another or on others is varied by adjusting the power, the pressure, the relative aperture size and/or the relative number of cathodes.

Also, in general, the thickness of a particular layer, either a compound or mixture or discrete material, is determined by the length of time the associated sputter cathode shutter(s) is open.

Based upon the above description and the following examples, those of usual skill in the art will be able to derive essentially an unlimited number of combinations of different compositions, compounds, alloys and mixtures of single and multi-layer metals carbides, etc.

For example, the capability to form films of composite materials and alloys extends to films of continuously varying composition, and thus continuously varying optical properties, in a direction perpendicular to the substrate plane. The composition profiling can be accomplished by continually or periodically varying the power applied to one or more of the sputtering sources or by continually varying the aperture or shutter opening at one or more of the sputtering sources. Three important device categories are possible:

Transparent anti-reflecting coatings can be produced comprising a single film with a refractive index varying from the refractive index of the substrate material at the substrate to the lowest practical value at the outer interface. Such devices would typically be used to provide anti-reflect ion coatings effective over very broad bandwidths, generally two or more octaves wide.

Opaque anti-reflection coatings, typically used to provide general and selective absorbing surfaces on metal surfaces, can be produced by varying the film composition from 100 percent of some metallic component to 100 percent of some transparent material at the outer interface.

Transparent films can be formed having a continuous periodically varying profile. The refractive index profile could be a simple profile of a fixed frequency, or a more complex frequency-modulated profile. Typical uses of such structures would be as very narrow band reflectors having one or more discrete narrow reflection bands separated by regions of high transmission. A typical application of such devices would be for the protection of the eye or of an optical system sensor from laser radiation incident on that system in its wavelength region of transparency.

G. In-Line Translational System

FIG. 18 is a schematic depiction of another alternative embodiment of our magnetron sputtering system, specifically, an in-line translational system 80 which is designed to coat flat substrates. Generally, the in-line translational embodiment has the same advantages relative to the prior art as the previously-described rotary system. System 80 also has the advantage relative to the previously described rotary embodiments of being able to coat very large, flat substrates. In rotary systems, such large substrates would require a drum diameter which is too large to be commercially practical. In addition, the in-line translational system 80 has the advantage, relative to prior art flat glass coating systems, of being able to provide equivalently high coating throughput using a chamber which is a fraction of the size of the prior art systems.

The embodiment 80 of our in-line translational system shown in FIG. 18 is typical of in-line coating systems, in that the use of modular subchambers is favored. Thus, system 80 comprises three basic chambers: a vacuum load lock chamber 81; a vacuum processing chamber 82; and a vacuum unload lock chamber 83. Each chamber is equipped with separate pumping systems 84 and separate high vacuum valves 86. The process chamber 82 can be isolated from the loading and unloading chambers by vacuum locks 87 and 88. Substrates are loaded through a vacuum lock or door 89 of the load lock chamber 87 and are unloaded through a similar vacuum lock 91 of unload lock chamber 83. The chambers, which are shown in cross-section in FIG. 18, typically are thin, flat boxes which can be mounted either horizontally or vertically.

Means such as endless conveyor belts 92, 93, 94 are provided in the chambers for transporting substrates. Please note, substrates such as glass window plates are sufficiently large to bridge the gaps between the conveyors and the different chambers. Load lock conveyor 92 is used to move a substrate at position 95 from the load lock 81 through lock 87 into the processing chamber 82 to position 96. (In referring to the substrates, reference numerals 95–98 denote substrate positions as well as the substrates themselves.) Processing chamber conveyor 93 transports substrates rapidly and typically at a constant velocity from entry position 96 in the direction 99 past bank 107 of processing stations 101–104 to position 97 an returns the substrates in the direction 100 past the processing stations to the position 96. Unload lock conveyor 88 receives substrates at vacuum lock 88 and transports them into the unload lock chamber 83.

Optionally, conveyors can be located outside the load lock chamber 81 and the unload lock chamber 83 to feed substrates to the load lock chamber 81 and unload substrates from the unload lock chamber 83.

As mentioned above, the illustrated processing chamber 82 contains four processing stations including, in order, an outside reaction station 101, intermediate or internal sputter stations 102 and 103 and outside reaction station 104. The various previously-described sputter devices and ion source devices can be used. All the processing stations are provided with baffles 106 to isolate the reaction and sputtering zones. The reaction stations 102,103 may be used to sputter a variety of materials and metals such as metal M1 and metal M2. Preferably, the sputter stations 102 and 103 and the reaction stations 101 and 104 use theabove-described linear configured magnetron sputter devices 30 and the inverse magnetron ion sources 40, respectively. The devices 30 and 40 are adapted in size to form long, narrow, linear deposition and reaction zones in which along the directions of movement 99 and 100 and the length of the zones encompass the substrates dimensions transverse to the length of the conveyors and the direction of movement.

Further embodiments of the system 80 will be readily derived by those of usual skill in the art, including, but not limited to, the three versions illustrated in simplified schematic form in FIGS. 19–21. The first variation 80A shown in FIG. 19 includes a load chamber 81, an unload chamber 83 and a process chamber 82A which comprises separate upper and lower banks 107 and 108 of sputtering and reaction zones instead of the single, upper bank 107 used in system 80, FIG. 18. The arrangement shown in FIG. 19 allows a substrate 96 to be coated simultaneously on both sides or allows two substrates mounted back-to-back to be coated simultaneously, each on one side.

FIG. 20 illustrates another alternative embodiment 80B comprising a processing chamber 82 and a load lock chamber 81 which also functions as the unload chamber. This embodiment can be utilized where either cost or space precludes the use of separate load lock and unload lock chambers.

FIG. 21 depicts a third alternative embodiment 80C which includes a load lock chamber 81, an unload lock chamber 83 and a process chamber 82B comprising two separate process chambers 82—82 separated by vacuum lock 109. This embodiment can be used either to enhance total system throughput or where a very high degree of isolation is required between the reactions in the two banks of processing stations 107—107.

Referring again to system 80, FIG. 18, to illustrate the operation of an in-line translational system, initially the locks or doors 87, 88 and 91 are closed and the processing chamber 82 and unload chamber 83 are pumped to a background pressure of about $10^{-6}$ torr. A substrate 92 is then loaded through the door 89 into the load chamber 81 and the lock 89 is then closed and the load chamber is pumped to a background pressure typically of $10^{-6}$ torr. The lock 87 is then opened, the substrate is transported into the processing chamber 82 to position 96, the lock 87 is closed and argon is inlet to the sputtering magnetrons 102 and 103 at a pressure which typically is about two microns. Power is then applied to the cathodes of the sputtering magnetrons 102 and 103 to begin sputtering metals such as M1 at cathode 102 and metal M2 at cathode 103. The shutters at the magnetrons 102 and 103 are closed during this period until the sputtering conditions stabilize. The reactant gas such as oxygen is then admitted to the ion sources 101 and 104 and the sources are ignited by applying the appropriate bias voltage.

To initiate coating, the shutter covering the aperture of magnetron 102 is opened and the substrate at 96 is transported at a constant velocity in the direction 99 past the processing stations to position 97, then is returned in the opposite direction 100 to position 96. The transport velocity and the sputtering parameters can be adjusted so that typically not more than three atomic layers of material is deposited in one pass and approximately twenty Angstroms of oxide is deposited in one forward and reverse cycle. The forward and reverse transport cycle is repeated until the desired oxide thickness of metal M1 has been built up on the substrate. At that point, the shutter for the magnetron 102 is closed.

The shutter covering the magnetron 103 is then opened and the process described in the preceding paragraph is repeated to deposit a layer of metal M2 oxide to the desired thickness. The two metal oxide deposition steps can be repeated until a desired multi-layered combination is deposited on the substrate. Also, layers of the metals M1 and/or M2 can be incorporated (that is, metals can be formed without oxidation) by keeping the shutters on the ion source devices closed during the associated pass of the substrate through the bank 107 of processing stations.

After the desired coating is formed, the pressure in the unload station 83 is raised to match the pressure in the process chamber 82. The lock 88 is opened and the coated substrate 97 is transported into the unload lock chamber 83 to position 98. The lock 88 is closed and the unload lock chamber 83 is raised to atmospheric pressure. Then the lock 91 is opened so that the substrate at position 94 can be removed from the unload lock chamber.

Quite obviously, the in-line translational system 80 can also be operated in a continuous mode in which the loading of new substrates into load chamber 81 and the unloading of previously processed substrates from the unload chamber 83 are synchronized with the coating process.

H. Examples

The following examples illustrate the ability of our process to deposit multi-layered, optical quality films in large quantities (high throughput) on different substrates, that is, substrates formed of different materials and including curved substrates. The films described in the following examples were all formed using the apparatus depicted in FIGS. 1–3 and, specifically, a drum 14 comprising the double rotational planetary gear arrangement 25 (for tubular or cylindrical substrates) and single rotational mounting positions 15 (for substrates such as sunglass lenses and lamp reflectors). The system used a 29 inch diameter drum rotated here at 48 rpm, a five-inch wide aperture in the isolation baffle, and a five-inch target width. The linear magnetron cathode 30 was used to sputter deposit various materials and the linear magnetron ion source 40 was used to oxidize the deposited materials.

The examples are characterized by the fact that the products described are required in large quantities, but with a high degree of consistency within any product type and the optical and mechanical properties of multi-layer systems which define the product function must be extremely uniform over the surface of the products.

With these products as examples, it is worth highlighting certain essential differences between our invention and the prior art discussed previously.

Our technique employs distinct separate non-contiguous zones for deposition and reaction. The overall pressure between the zones is low which minimizes arcing and subsequent loss of film thickness control.

The deposition and reaction zones at the periphery of the drum are long and narrow permitting the installation of multiple stations around the circumference of the cylindrical work surface. This is essential if more than one material must be deposited in the same process cycle, which is a requirement in all of the examples that we describe.

In addition to permitting an increased number of stations, the long narrow regular shape of the deposition and reaction zones permits the use of a large number of individual substrates and a large substrate area, with resultant high throughput, because a large number of reaction zones, as well as deposition zones can be positioned about the circumference of the rotating substrate carrier and because all substrates located around the work surface are exposed to the same material flux and plasma conditions. This ensures a very high degree of control of film thickness on the different substrates, which is essential for consistency within a product type.

The lack of a requirement for tight baffling between the deposition zone and substrate carrier permits the coating of substrates with curvature such that this tight baffling would not be practical. For example, it permits the coating of lenses and tubes.

1. Curved Glass "Cold" Mirrors (M16 & M13.25)

Figure 11:
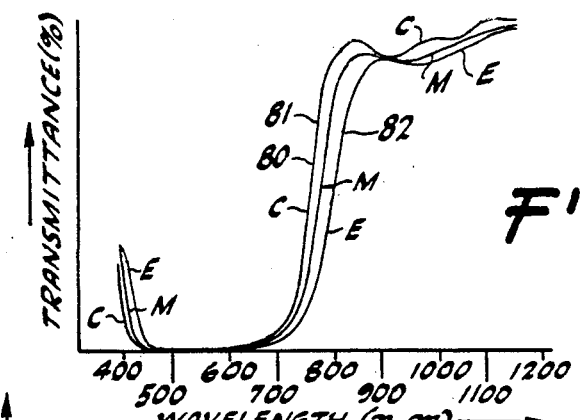
FIGS. 11-16 depict one or both the transmittance and reflectance curves for (a) optical quality films deposited on curved glass mirrors (FIG. 11), glass eyeglass lenses (FIG. 12), plastic eyeglass lenses (FIG. 13), and for (b) anti-reflective coatings on plastic (FIG. 14), yellow headlamp filter coatings (FIG. 15), and mirror coatings on infrared radiant heating lamps (FIG. 16)

The system shown in FIGS. 1–3 was used in the single rotation mode to form reflective multi-layer oxide coatings comprising alternating layers of titanium dioxide and silicon dioxide on the concave inner surface 76 of glass lamp reflector substrates 75, FIG. 17, using the process of Table 1. See substrate position 15B, FIG. 1. Effectively, we coated the deep dish reflector surface 76 with two materials with precisely controlled uniformity at a high deposition rate. The coatings comprised twenty-one layers, $$\text{substrate} \left| \frac{(H/2\ L\ H/2)^5}{627\ \text{nm}} \quad \frac{(H/2\ L\ H/2)^5}{459\ \text{nm}} \right| \text{ambient,}$$

where L=silicon dioxide and H=titanium dioxide, with the two stacks $(H/2\ L\ H/2)^5$ centered at QWOT (quarter wave optical thicknesses) of 627 nm and 459 nm, respectively. In the industry standard notation used above, each $(H/2\ L\ H/2)^5$ indicates a five-fold repetition of the layer sequence comprising, in order, a one-half QWOT layer of titanium oxide (H/2); a QWOT layer of silicon dioxide (L); and another one-half QWOT layer of titanium oxide (H/2). Referring to FIG. 11, as demonstrated by curve 80, 81 and 82 for the percent transmittance curve as a function of wavelength at the film center, middle, and edge, respectively, the coatings possessed the desired E/C ratio of 1.05 and otherwise achieved the spectral performance design objective of transmitting infrared light energy, i.e., light of wavelength greater than approximately 700 nm, while reflecting visible energy without color alteration of the bulb light source.

TABLE 1

| | |
|---|---|
| Substrate: | Concave Glass |
| Rotary Motion: | Single |
| Material 1: | Titanium to form $TiO_2$ |
| Material 2: | Silicon to form $SiO_2$ |
| Cathode Rate, | |

TABLE 1-continued

| | |
|---|---|
| Material 1 (CR1): Cathode Rate, | 110 Angstroms/sec (A/s) |
| Material 2 (CR2): | 90 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.0 microns |
| Ion Source Operation for Material 1: | 4 amps; 125 sccm $O_2$ |
| Ion Source Operation for Material 2: | 2 amps; 100 sccm $O_2$ |
| Post Operation Bake (after completion of coating): | 550° C. in air one hour |

2. Glass Eyeglass Lenses

Figure 12:
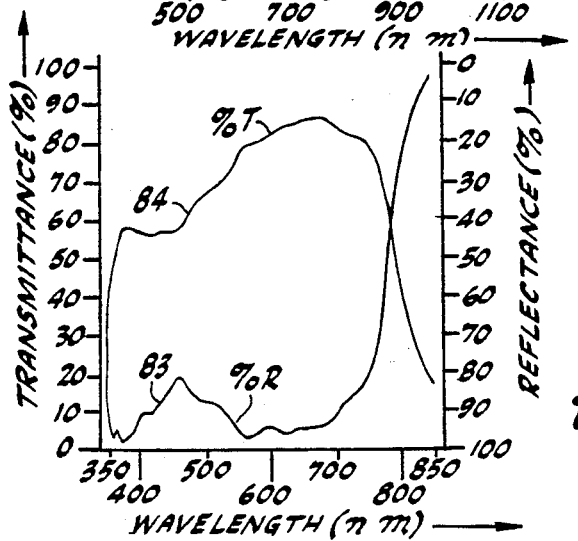

The apparatus described above and depicted in FIGS. 1–3 was also used in the single rotation mode to form a twenty-six layer optical quality coating comprising alternating layers of tantalum pentoxide and silicon dioxide on convex glass lenses using the process parameters of Table 2. As demonstrated by the percent reflectance curve 83 of FIG. 12 and the percent transmittance curve 84, also in FIG. 12, the coatings achieved the spectral performance design goals of providing a rejection band in the near infrared for filtering damaging infrared rays from the eyes as well as a rejection band in the ultraviolet and very high film durability characterized by the standard eraser rub, abrasion resistance test per MIL-C-675. In addition to the eye protecting features of the film, visible light is selectively filtered over the approximate range 400–700 nm by the coating design (layer thicknesses) to achieve different cosmetic coloring without substantially affecting visible light transmittance. This design requires stringent control of the optical thickness of the constituent layers to achieve stringent color reproducibility requirements. Product produced using our invention is a factor of two more uniform than product produced by prior art methods.

TABLE 2

| | |
|---|---|
| Substrate: | Glass Sunglass Lenses |
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 2 amps; 99 sccm $O_2$ |
| Post Operation Bake: | 450° C. in air one hour |

3. Plastic Eyeglass Lenses

Figure 13:
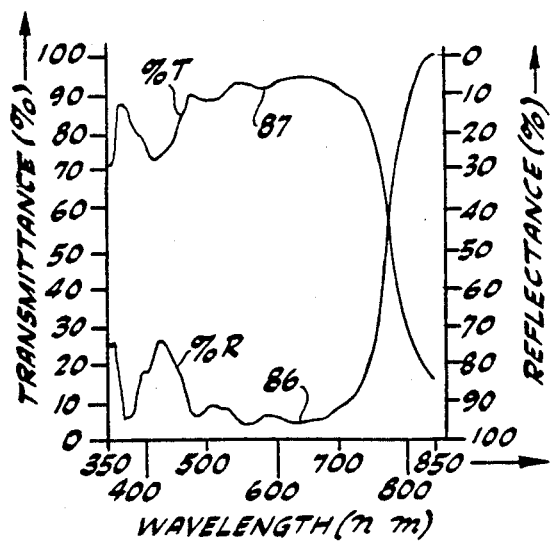

The apparatus depicted in FIGS. 1–3 was used in the single rotation mode with the process of Table 3 to deposit the same twenty-six layer blue filter film described in Example 2 having a rejection band in the near infrared for filtering damaging infrared rays from the eyes as well as a rejection band in the ultraviolet. However, the substrate in this case were plastic sunglass lenses rather than glass lenses. Referring to FIG. 13, as evidenced by the percent reflectance curve 86 and the percent transmittance curve 87, the thin film coatings achieved the optical design objectives discussed in Example No. 2 and the additional objective of Example No. 2 and the additional objective of deposition on the plastic without melting or softening the plastic, because the process temperature is very low, about 55° C. This demonstrated capability is in distinct contrast to all known prior art vacuum coating processes, for which the formation of multi-layer, durable, optically-transparent coatings on plastic substrates has traditionally been a difficult task. These thin film coating also passed humidity exposure (MIL-M-13508) and snap tape adhesion tests (MIL-M-675).

TABLE 3

| | |
|---|---|
| Substrate: | Plastic Sunglass Lenses |
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 3 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 4 amps; 99 sccm $O_2$ |
| Post Operation Bake: | None |

4. Anti-Reflective Coatings for Plastic

Figure 14:
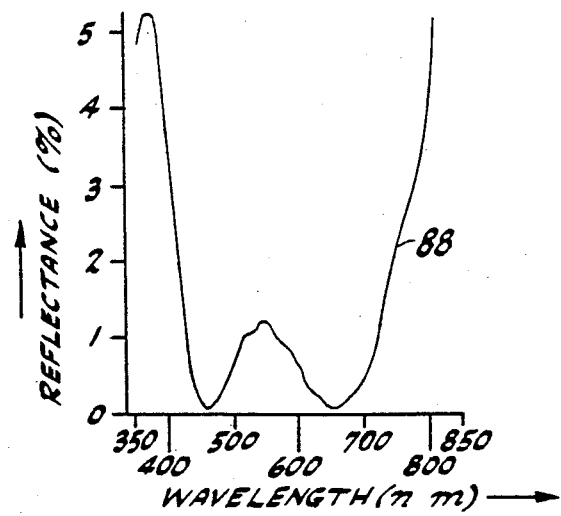

The apparatus described in FIGS. 1–3 was operated in the single rotation mode in accordance with the process shown in Table 4 to form four layer optical films comprising alternating layers of tantalum pentoxide and silicon dioxide on flat and convex curved plastic substrates using a process temperature of approximately 55° C. The films comprised four layers:

substrate|(HLHL)|ambient, where L=silicon dioxide and H=tantalum pentoxide and where the QWOT HLHL were centered, respectively, at 117 nm, 172 nm, 1096 nm and 520 nm. Referring to reflectance curve 88, FIG. 14, the films satisfied the design objectives of providing very low reflectance over the visible wavelength spectrum and depositing very thin (~100 nm thick) layers with repeatability and without melting or softening the plastic.

TABLE 4

| | |
|---|---|
| Substrate: | Polycarbonate & Acrylic |
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 3 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 4 amps; 99 sccm $O_2$ |
| Post Operation Bake: | None |

5. Yellow Headlamp Filter Coating

Figure 15:
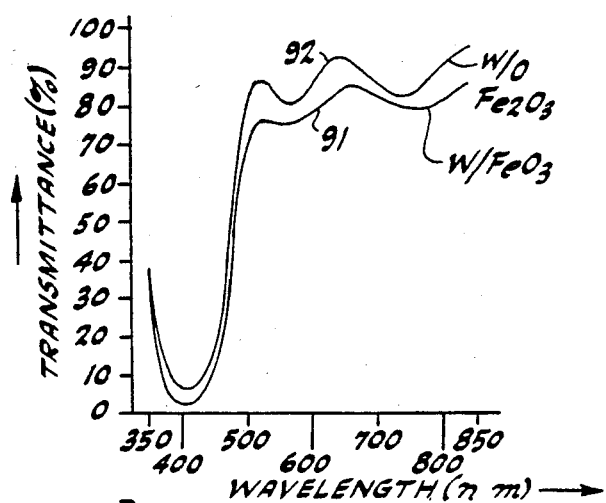

The apparatus depicted in FIGS. 1–3 was also used to deposit fourteen layer films on the quartz envelopes of halogen headlamp bulbs using the double rotation mode and the process of Table 5. The films incorporate three materials, require precise color matching of the multiple materials and require precise control of the constituent thin one-quarter wave layers. As a consequence, the film design is a difficult one to implement. The specific film design is a was:

$$\text{substrate}|Fe_2O_3(H)(LH)^6|\text{ambient},$$

where L=silicon dioxide and H=tantalum pentoxide and the QWOT $Fe_2O_3$, H and (LH) were centered, respectively, at 14 nm, 10 nm and 430 nm. The films demonstrated the ability to reproducibly deposit a multi-layer blue filter of design $Fe_2O_3$ $(H)(LH)^6$ on the quartz envelope. The $Fe_2O_3$ was used here as a selective absorber. The spectral performance of these films is depicted in FIG. 15. Curve 91 depicts percent transmittance when the $Fe_2O_3$ absorber layer is used; curve 92 describes the performance without the $Fe_2O_3$ layer. FIG. 15 demonstrate that the combination of the multi-layer blue filter and the $Fe_2O_3$ selective absorber transmits yellow light over the range of approximately 500-600 nm and blocks the transmission of blue light at about 450 nm and eliminates the characteristic blue corona associated with high angle reflectance and subsequent transmittance through the glass envelope.

TABLE 5

| | |
|---|---|
| Substrate: | Halogen Lamp Envelopes |
| Rotary Motion: | Double (planetary) |
| Material 1: | Tantalum to form $Ta_2O_5$ |
| Material 2: | Silicon to form $SiO_2$ |
| C.R. 1: | 150 A/s |
| C.R. 2: | 100 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 1 amp; 200 sccm $O_2$ |
| Ion Source Operation for Material 2: | 1 amp; 100 sccm $O_2$ |
| Post Operation Bake: | 600° C. in air one hour |

6. Thin Hot Mirror Coatings

Figure 16:
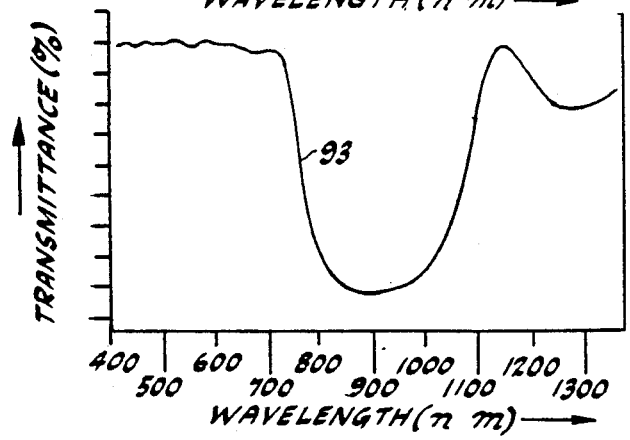

The apparatus depicted in FIGS. 1-3 was operated in the double-rotational mode to form fifteen-layer films on tubular quartz lamp envelopes used in infrared (IR) radiant energy heating lamps. The coatings are termed "thin hot mirror" because they are designed to transmit visible energy while reflecting infrared energy emitted by the internal tungsten halogen filament. The coating leads to lamp powder reduction because the infrared energy is geometrically incident on the lamp filament. The energy is used to heat the filament, thereby decreasing the amount of electrical power required to operate the lamp. The specific film design was:

$$\text{substrate}|(L/2\ H\ L/2)^5|\text{ambient}$$
$$\lambda = 900\ nm$$

where L is silicon dioxide, H is tantalum pentoxide and the QWOT was centered at 900 nm. The spectral performance of these films is depicted in FIG. 16. Curve 93 depicts percent transmittance as a function of wavelength and demonstrates that the hot mirror film or coating transmits visible light over the range of approximately 400-750 nm and reflects IR energy over the approximate range 750-1100 nm back to the filament.

TABLE 6

| | |
|---|---|
| Substrate: | 10 mm Quartz tubes |
| Rotary Motion: | Double (planetary) |

TABLE 6-continued

| | |
|---|---|
| Material 1: | Tantalum to form $Ta_2O_5$ |
| Material 2: | Silicon to form $SiO_2$ |
| C.R. 1: | 150 A/s |
| C.R. 2: | 100 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 2 amps; 199 sccm $O_2$ |
| Ion Source Operation for Material 2: | 2 amps; 99 sccm $O_2$ |
| Post Operation Bake: | 600° C. in air one hour |

Having thus described previous preferred and alternative embodiments of our invention, it will be appreciated that those of usual skill in the art will readily modify and extend the described invention based upon the disclosure here and within the scope of the following claims.

We claim:

1. A sputter coating system, comprising: a vacuum chamber; a rotatable drum mounted within said chamber adapted for mounting substrates thereon for rotating the substrates; at least one linear magnetron sputter device positioned at a work station adjacent the circumference of said drum and adapted for sputtering at least a selected material onto said substrate; and at least a second device positioned adjacent the circumference of said drum and adapted for providing a plasma for effecting chemical reaction with said selected material.

2. The system of claim 1, wherein the second device is adapted for providing a reactive atmosphere selected to at least partially convert said selected material to at least one of an oxide, a nitride, a hydride or a carbon-containing alloy or compound.

3. The system of claim 2, wherein the second device is adapted for oxidizing said selected material.

4. The sputter coating system of claim 1, wherein the magnetron sputter device and the second device are positioned outside the drum.

5. The sputter coating system of claim 1, wherein the magnetron sputter device and the second device are positioned inside the drum.

6. The sputter coating system of claim 1, further comprising substrate support means rotatably mounted at the circumference of said drum for rotatably presenting selected substrates or surface segments thereof to the work station.

7. The sputter coating system of claim 6, wherein the rotatable mounting means comprises a planetary gear arrangement which is rotatable in conjunction with rotation of the drum.

8. The sputter coating system of claim 1, further comprising at least a second linear magnetron sputter device or group of linear magnetron sputter devices adapted for depositing at least a second material onto substrates at a second work station or group of work stations adjacent the circumference of said drum.

9. A magnetron sputtering system for sputter depositing at least one selected material on a substrate and effecting reaction of said material with a reactive plasma, comprising: a vacuum chamber; a rotatable drum mounted within said chamber and adapted for mounting substrates thereon for rotating the substrates past associated selected work stations; said drum and said vacuum chamber defining therebetween a relatively narrow elongated reaction volume; at least one linear magnetron sputter device positioned at a first work station location adjacent the circumference of said drum and comprising a target of selected material adapted for generating a first plasma throughout the reaction volume for sputter depositing the at least one selected material onto said substrates at a relatively low ambient partial pressure of said reactive gas; and at least one ion source device positioned at a second work station location adjacent the circumference of said drum and adapted for applying a reactive gas in interaction with the plasma associated with the sputter device for generating a second plasma in said reaction volume to effect reaction of ions of said reactive gas with said sputter-deposited material.

10. The system of claim 9, wherein the ion source device is adapted for providing a reactive atmosphere selected to at least partially convert said selected material to at least one of an oxide, a nitride, a hydride or a carbon-containing alloy or compound.

11. The system of claim 10, wherein the ion source device is adapted for oxidizing said selected material.

12. The system of claim 9, wherein the ion source device is a linear magnetron device.

13. The system of claim 9, wherein the ion source device is an ion gun.

14. The system of claim 9, further incorporating and being adapted for operating at least two of said sputtering devices simultaneously for sputter depositing at least two materials simultaneously.

15. The magnetron sputtering system of claim 9, wherein the sputter device is positioned outside the drum.

16. The magnetron sputtering system of claim 9, wherein the sputter device is positioned inside the drum.

17. The magnetron sputtering system of claim 9, further comprising substrate support means rotatably mounted adjacent the circumference of the drum for rotatably presenting selected substrates or surface segments thereof to the work station.

18. The magnetron sputtering system of claim 17, wherein the rotatable mounting means comprises a planetary gear arrangement which is rotatable in conjunction with rotation of the drum.

19. A magnetron sputtering system, comprising: a rotating drum; unwind and wind roll means internal to said drum and adapted for traversing a flexible web through an opening in said drum and about the external circumference of said drum continuously or intermittently; and at least a first linear magnetron sputterer or first group of linear magnetron sputterers selectively positioned about the periphery of said drum for depositing at least a first material on said web or substrates mounted thereon.

20. A magnetron sputtering system adapted for sputter depositing at least a first material on a web or substrates mounted thereon and for selectively oxidizing said material in reactive gas, comprising: a rotating drum; unwind and wind roll means internal to said drum and adapted for traversing a flexible web through an opening in and about the external circumference of said drum continuously or intermittently; at least a first linear magnetron sputter device or first group of linear magnetron sputter devices positioned at selected work stations about the periphery of the circumference of said drum for selectively depositing at least a first material onto said drum or substrates mounted thereon, the cathode of said magnetron being surrounded by baffle means for substantially enclosing a sputter chamber region between said cathode and said associated workpiece station; and at least a second ion source device or group of said second devices positioned at associated work stations and adapted for oxidizing said sputter deposited material at a relatively high partial pressure of said reactive gas.

21. The system of claim 20 incorporating and adapted for operating at least two of said linear magnetron sputtering devices simultaneously for sputter depositing at least two materials simultaneously.

22. A low temperature, high formation rate process for forming single layer films and multi-layer composites on substrates, comprising: providing a vacuum chamber having a rotatable cylindrical workpiece mounting support formed therein and at least a first linear magnetron sputter device positioned adjacent the circumference of the drum for depositing a selected material onto the workpiece and at least a first oxidizer device positioned adjacent the periphery of the cylindrical support for oxidizing said sputter-deposited material; pulling a vacuum in said chamber; rotating said support; and selectively and sequentially operating said devices to deposit a layer of said material on said substrate and oxidize said layer.

23. The magnetron sputtering process of claim 22, further comprising sequentially sputter depositing a stack of materials on said substrate and selectively operating the oxidizing devices to oxidize at least selected ones of said layers prior to sputter deposition of the next successsive layer.

24. A sputter coating system comprising: a vacuum chamber; a movable workpiece carrier mounted within said vacuum chamber and adapted for mounting substrates thereon for moving the substrates past at least first and second physically spaced work stations; a linear magnetron-enhanced sputter device positioned at said first work station and including a target of selected material and means for generating an associated plasma within said device and adjacent said work station and substantially throughout an extended region of the chamber including the physically spaced second work station, for sputter depositing material on said substrates traversing the first work station; and a linear magnetron-enhanced ion source positioned at said second work station and adapted for using electrons from said plasma associated with said sputter device and applying reactive gas to form along a relatively narrow zone adjacent the workpiece carrier a second plasma comprising ions of the reactive gas, the ion source further comprising means for applying a directed potential between said ion source and said plasma associated with said sputter device for accelerating the reactive ions to the substrates for effecting a selected reaction with the sputter-deposited material; and means adapted for reciprocating the substrate carrier past the work stations a plurality of times to achieve the desired film coating thickness.

25. The sputter coating system of claim 24, wherein said workpiece carrier is cylindrical and rotatably moves the substrates past the first and second work stations and wherein said selected reaction occurs along a circumferential zone of the carrier comprising substantially less than one-half the circumference of the carrier.

26. The sputter coating system of claim 24, wherein said workpiece carrier is substantially flat and said movement is substantially linear.

27. The sputter coating system of claim 24, further comprising at least a second sputter device for sputter depositing the selected material.

28. The sputter coating system of claim 27, further comprising at least a plurality of said linear magnetron-enhanced ion sources for reacting selected reactive gas with the sputter deposited material.

29. The sputter coating system of claim 24, further comprising at least a second sputter device adapted for depositing at least a second material onto substrates.

30. The sputter coating system of claim 29, further comprising at least a plurality of said linear magnetron-enhanced ion sources for reacting selected reactive gas with the sputter deposited material.

31. The sputter coating system of claim 24, further comprising a multiplicity of sputter devices adapted for depositing at least first and second materials onto substrates.

32. The sputter coating system of claim 31, further comprising at least a multiplicity of said linear magnetron-enhanced ion sources for reacting selected reactive gas with the sputter deposited material.

33. The sputter coating system of claim 24, wherein the ion source is adapted for the inlet of a reactive atmosphere selected to at least partially convert said selected materials to at least one of an oxide, nitride, hydride or carbon-containing alloy or compound.

34. The system of claim 33, wherein the ion source is adapted for oxidizing said selected materials.

35. A process for forming single layer films and multilayer composite films on substrates, comprising: providing a vacuum chamber having a movable workpiece carrier thereon and at least one magnetron-enhanced sputter cathode device positioned adjacent the workpiece carrier for sputter depositing a selected material onto the workpiece; providing at least one ion source device positioned adjacent the workpiece carrier for providing a selected reaction with the selected material; pulling a vacuum in the chamber; moving the carrier past the devices; selectively operating the sputter cathode device to deposit a layer of the selected material on the substrate; and selectively operating the ion source device in sequence with the sputter cathode device for substantially completing the selected reaction during a single pass of the carrier.

36. The process of claim 35, wherein the workpiece carrier is cylindrical and the movement is rotational and wherein the selected reaction occurs along a fractional circumferential surface zone of the carrier comprising a distance substantially less than one-half the circumference of the carrier and the selected reaction is substantially completed during translation of said workpiece through said fractional distance.

37. The process of claim 35, wherein the workpiece carrier is substantially flat and the movement is substantially linear.

38. The deposition process of claim 35, wherein the selected reaction converts the sputter-deposited material to at least one of an oxide, a nitride, a hydride, a sulfide or a carbon-containing alloy or compound.

39. The deposition process of claim 35, wherein the selected reaction is oxidation and at least partially converts the selected material to an oxide thereof.

40. The deposition process of claim 35, further comprising operating the sputter cathode device to sputter deposit layers of selected materials on the substrate and selectively and sequentially operating the ion source device to react at least selected ones of the layers prior to sputter deposition of the next successive layer.

41. The deposition process of claim 40, wherein the selected reaction converts the sputter-deposited material to at least one of an oxide, a nitride, a hydride, a sulfide or a carbon-containing alloy or compound.

42. The deposition process of claim 40, wherein the selected reaction converts at least selected ones of the layers to oxides of the selected materials.

43. The deposition process of claim 35, further comprising: providing at least a plurality of sputter cathode devices.

44. The deposition process of claim 43, further comprising: providing at least a plurality of the ion source devices.

45. The deposition process of claim 35, further comprising: providing at least a plurality of the ion source devices.

46. The sputter deposition process of claim 35, further comprising selectively and sequentially operating the sputter cathode and the ion source devices to form a composite coating comprising at least a plurality of layers, the composition of each said layer being selected from at least one of a first metal, a second metal, an oxide of the first metal, an oxide of the second metal, mixtures of the first and second metals and an oxide of mixtures of the first and second metals.

47. The deposition process of claim 46, further comprising sequentially operating selected ones of the sputter cathode devices to sputter deposit layers of selected materials on said substrate and selectively and sequentially operating selected ones of the ion source devices in conjunction with supplying selected reactant gas thereto for effecting the selected reaction with at least selected ones of the layers prior to sputter deposition of the next successive layer.

48. The deposition process of claim 47, wherein the selected reaction involves converting the selected layers to at least one of oxide, nitride, hydride, sulfide or carbon-containing compound or mixture.

49. The deposition sputtering process of claim 47, wherein the selected reaction is oxidation.

50. A process for forming single layer films and multilayer composite films on substrates, comprising: providing a vacuum chamber having a rotatable cylindrical workpiece carrier therein and at least one magnetron-enhanced sputter cathode device positioned adjacent the circumference of the carrier for sputter depositing a selected material onto the workpiece; providing at least one ion source device positioned adjacent the circumference of the workpiece carrier for providing a selected reaction with the workpiece during travel thereof along a fractional circumferential surface zone of the carrier comprising substantially less than one-half the circumference of the carrier; pulling a vacuum in said chamber; rotating the carrier; selectively operating the sputter cathode device to deposit a layer of the selected material on said substrate; and selectively operating the ion source device in sequence with said sputter cathode device for substantially completing the selected reaction during one pass of the workpiece along the surface zone.

51. A process for forming on concave substrates single layer films and multi-layer composite films of selected variable thickness profile in the direction from the center to the edge of the substrate, comprising providing a linear magnetron-enhanced sputter cathode device having an associated sputtering zone of relatively elongated height and relatively narrow width; providing a rotatable cylindrical workpiece carrier adjacent the sputtering cathode device and supporting the substrate along the circumference thereof for traversing past the sputtering device; providing a linear magnetron-enhanced ion source device having an associated reaction zone of relatively elongated height and relatively narrow width for providing a selected reaction with the deposited coating along a fractional circumferential zone of the carrier substantially less than one-half the circumference of the carrier; rotating the cylindrical workpiece carrier; selectively operating the sputtering cathode device to deposit at least a layer of selected material on the rotating substrate; and selectively operating the ion source device to effect the selected reaction and complete the selected reaction during a single traversal of the workpiece through the fractional circumferential zone.

* * * * *